United States Patent [19]

Hetrich

[11] 4,061,042
[45] Dec. 6, 1977

[54] AUDIO SIGNAL MONITORING SYSTEM WITH DISPLAY OF TWO SIGNAL CHARACTERISTICS

[75] Inventor: Wayne L. Hetrich, District Heights, Md.

[73] Assignee: Corporation for Public Broadcasting, Washington, D.C.

[21] Appl. No.: 576,746

[22] Filed: May 12, 1975

[51] Int. Cl.² ............................................. G01H 3/12
[52] U.S. Cl. .................................................... 73/647
[58] Field of Search ................ 73/557, 556, 555, 558, 73/552, 69, 70; 179/1 R, 1 N; 360/31; 340/261

[56] References Cited

U.S. PATENT DOCUMENTS

| 3,200,899 | 8/1965 | Krauss | 73/557 |
| 3,615,162 | 10/1971 | Barber | 73/557 |
| 3,848,471 | 11/1974 | Hamburg et al. | 73/557 |
| 3,991,628 | 11/1976 | Narita | 73/557 |

FOREIGN PATENT DOCUMENTS

| 515,160 | 11/1939 | United Kingdom | 73/558 |

OTHER PUBLICATIONS

Frye, Radio–Electronics, "The Vu Meter and its Uses," Nov. 1955, pp. 77-80.

Primary Examiner—Richard C. Queisser
Assistant Examiner—Stephen A. Kreitman
Attorney, Agent, or Firm—Staas & Halsey

[57] ABSTRACT

An audio signal monitoring system is disclosed, which provides simultaneous visual indication of instantaneous peaks of a monitored audio signal and of peaks which are sustained for a predetermined period of time. A high impedance buffer combined with a precision full wave rectifier receives the monitored audio signal and generates a corresponding d.c. signal which varies according to the amplitude level of the audio signal. A peak detection circuit is connected to receive the d.c. signal and drive a meter movement to indicate instantaneous peaks in the audio signal level. A comparator circuit is connected to receive the d.c. signal and compare the d.c. signal with several predetermined threshold levels. Separate indicators corresponding to each threshold level are selectively energized by the comparator circuit whenever the d.c. signal exceeds the respective threshold levels for a sustained period of time.

24 Claims, 3 Drawing Figures

AUDIO SIGNAL MONITORING SYSTEM WITH DISPLAY OF TWO SIGNAL CHARACTERISTICS

BACKGROUND OF THE INVENTION

1. Field of the Invention

The invention relates to audio signal monitoring systems and, more particularly, to a method and indicating instrument for providing an operator with an coordinated display of two audio signal characterisitcs indicative of instantaneous signal level and coordinated signal energy.

2. Description of the Prior Art

In the fields of broadcasting and recording, an instrument capable of indicating the amplitude of the sound signal has been necessary to permit control of the dynamic range of the total audio system — constrained at one extreme by the inherent noise level and at the other extreme by the onset of unacceptable distortion of the wanted signal. The problem is intensified by the fact that the human ear has a logarithmic intensity characteristic. Also, the ear judges loudness of sound largely by comparison with immediately preceding sound levels. The ear's subjective impression of loudness is largely determined by the total energy in the sound wave and the instantaneous peak sound pressure. Thus not only amplitude but also the wave shape and symmetry of the sound signal influences the ear and consequently judgments of intensity. Human speech and percussive sounds, for example, contain many short duration, high level peaks, while music generally, and especially the sounds of stringed and wind instruments, have less "spiky" or more symmetrical waveforms. Nevertheless, these two types of vastly differing waveshapes may have the same apparent loudness.

The problem of controlling broadcasting and recording volume thus is a matter of compromise. It is necessary to compress the intensity range in such a way that the original apparent loudness values are preserved as much as possible, yet at the same time make use of the fullest possible modulation depth of the broadcasting or recording medium.

The VU (volume unit) meter previously used for sound measurements in connection with volume control is patterned on so-called standards defined for it and agreed on by the industry. Thus its rectifier characteristics are in the form I=KE where E equals the applied voltage, I the current passed, and K a constant. The meter is scaled so that the 100% mark is at approximately 0.74 of the full scale deflection. The impedance of the meter and rectifier when indicating 100% under the influence of an applied sinusoidal voltage is 3,900 ohms. The sensitivity of the combination shall be such that when 1.228 volts r.m.s. is applied in series with an additional resistance of 3,600 ohms, the indication is typically between the 100% mark and 0.8 of full scale. The speed of the response is such that if 1.228 volts r.m.s. is suddenly applied, the pointer attains 99% of its final deflection within 0.3 seconds with an overswing of not less than 1% or more than 1.5%. With the overall impedance of the meter circuit being 7,500 ohms, the meter indicates 100% when a tone level of +4 dbm (decibels, referred to 1 milliwatt) is present across the standard 600 ohm feed line.

The VU meter, when bridged across the 600 ohm feed line, has been found to load the line and to cause frequency and level sensitive disturbances on the line which can be significant in a complex system using many VU meter circuits. Being an averaging or integrating device, the VU meter embodies ballistics which will not allow it to provide accurate indication of absolute levels of signals less than approximately 80 milliseconds in duration. The indication further appears to depend on waveform since the asymmetrical character of waveforms produced by the human voice in speaking and singing cannot be indicated as accurately as the more symmetrical music waveforms due to averaging characteristics of the meter ballistics. Also, the rectifiers in VU meters follow a square law type curve and thus are non-linear. These undesirable characteristics of the standard VU meters do not provide the information which recording mixers and operators require to attain the most satisfactory results, especially in view of the demands of today's unusual sounds in program material.

OBJECTS AND SUMMARY OF THE INVENTION

It is accordingly an object of the present invention to provide a novel audio signal monitor that obviates at least some of the foregoing problems associated with prior art VU meters.

It is another object of the invention to provide a novel audio signal monitor which is compatible with established operator preferences, habit patterns and control philosophies.

It is yet another object of the present invention to provide a novel audio signal monitor which delivers more accurate indications of energy levels regardless of signal waveform, symmetry or duration.

It is a further object of the present invention to provide a novel audio signal monitor wherein the meter scale calibration reflects the actual instantaneous levels of an audio input signal rather than average levels and to provide precise indication of the system overload point without the necessity for the operator to move his eyes from the area of the display.

It is yet a further object of the present invention to provide a novel audio signal monitor having a coordinated LED/METER display wherein the delay, attack, and decay, parameters of the coordinated LED/METER display agree substantially with subjective loudness judgments for indicating peak levels for both music and speech.

It is still a further object of the present invention to provide a novel audio signal monitor having a display that correlates with the ability of the human ear to hear distortion based on the duration of the non-linearity.

The present invention accomplishes these and other objects by providing a coordinated display of two separate characteristics of the signal level from which more accurate and complete information can be obtained. The display of the first characteristic is provided by a meter movement which responds to signal voltage in rectified form to provide a fast rise and very slow fallback of the meter movement in order, respectively, to accurately indicate instantaneous peak voltage levels, and to provide the operator with an indication of the integrated program energy over a much longer period of time because of slow fallback of the movement when the signal level drops. The second characteristic is provided by a display indicator, such as a plurality of LEDs (Light Emitting Diodes) controlled threshold with respect to the same rectified signal. In the preferred embodiment, the LEDs are arranged to be selectively energized at respectively corresponding ones of a plurality of predetermined signal levels, on the further condition that any such corresponding level has been sustained for a period of at least 10-14 milliseconds. That period corresponds to what has been found to be the shortest time in which the ear can detect signal clipping.

These and other objects and advantages of the present invention will be appreciated from a consideration of the following description when read in conjunction with the appended drawings.

DETAILED DESCRIPTION OF THE PREFERRED EMBODIMENT

Figure 1:
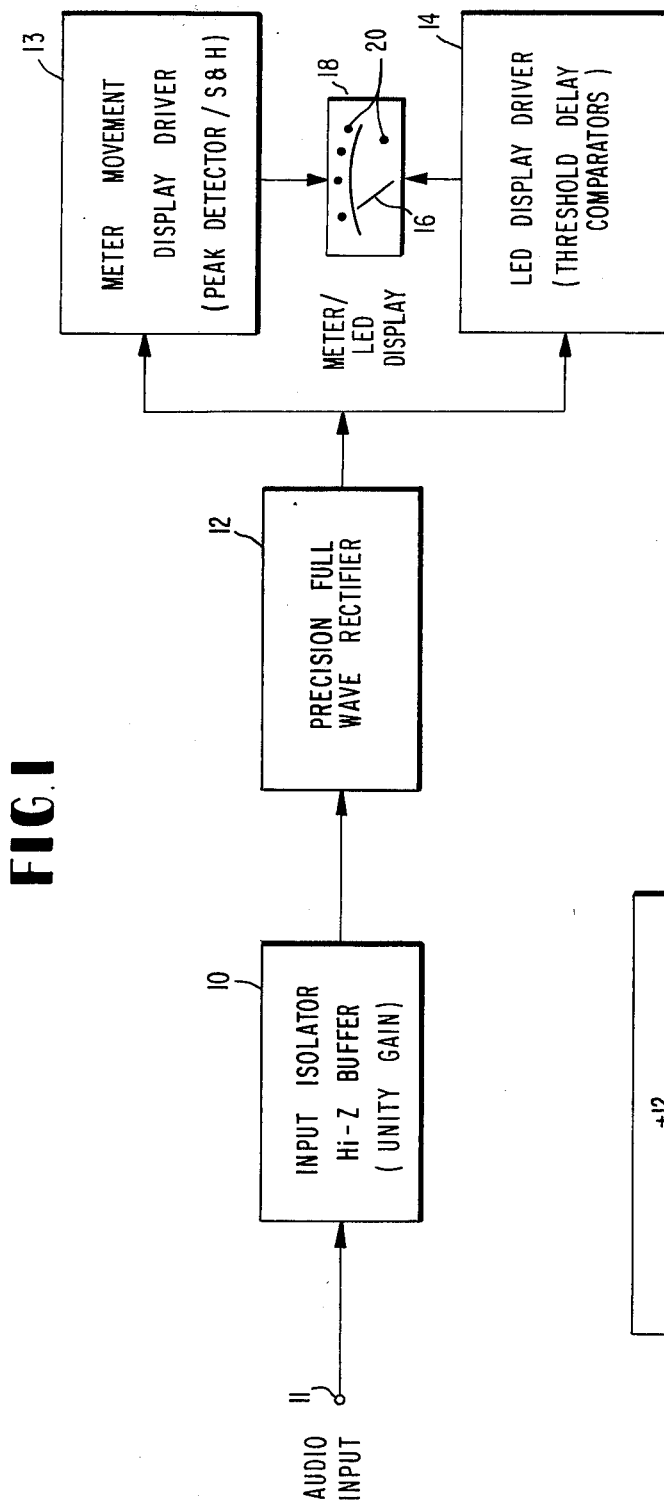
FIG. 1 is an overall block diagram of an embodiment of the audio signal monitor incorporating the principles of the invention.

In FIG. 1, an input isolation buffer amplifier 10 presents a high impedance to an audio input signal supplied to the buffer from an input terminal 11 and provides an output signal with unity gain. The output signal is applied to a precision full wave rectifier 12. The output signal from the rectifier 12 is supplied to a meter movement display driver 13 and to an LED display driver 14.

The meter movement driver 13 functions as a peak detector and a sample and hold circuit to provide a fast rise and slow fallback signal to a meter movement operating a pointer 16 on a display device 18 as will be described hereinafter in greater detail. The LED display driver 14 includes delay threshold comparator circuits for energization of, for example, five LEDs 20 mounted on the display device 18.

Figure 2:
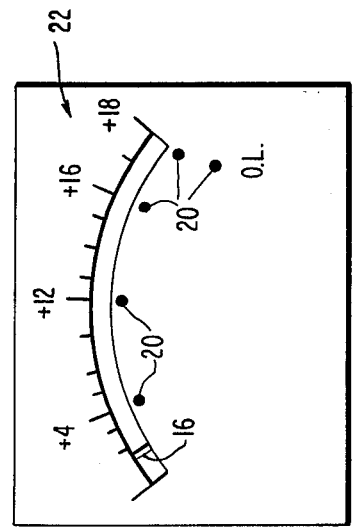
FIG. 2 is a plan view of the display device of the audio level indicator of FIG. 1; and, FIG. 3 is a detailed schematic diagram of the audio signal monitor embodiment of FIG. 1.

Referring to FIG. 2, four of the LEDs are mounted in the display device 18 adjacent the +4, +12, +16 and +18 marks, respectively, on a db scale 22 for meter pointer 16. The fifth, LED indicator designated O.L. (overload), is shown located near the end mark +18 of the db scale 22. The LED indicators are selectively energized when the signal level corresponding to their (placement) level indications with respect to the meter scale has been sustained for a predetermined period of about 10-14 milliseconds (the shortest time in which the human ear can detect signal clipping).

At steady state condition, with a sine wave input signal applied to the terminal 11, the frequency response of the meter movement is +0 to -2 db over 20 Hz to 15 KHz. The frequency response of the LED display is ±0.1 db over 20 Hz to 20 KHz.

As noted, the peak waveform duration must exceed 10-14 milliseconds at any LED calibrated level to activate the LED at that level. The LED indicators are totally on or off with no dimming and remain on long enough after a peak to permit the operator to make intelligent level judgments.

Figure 3:
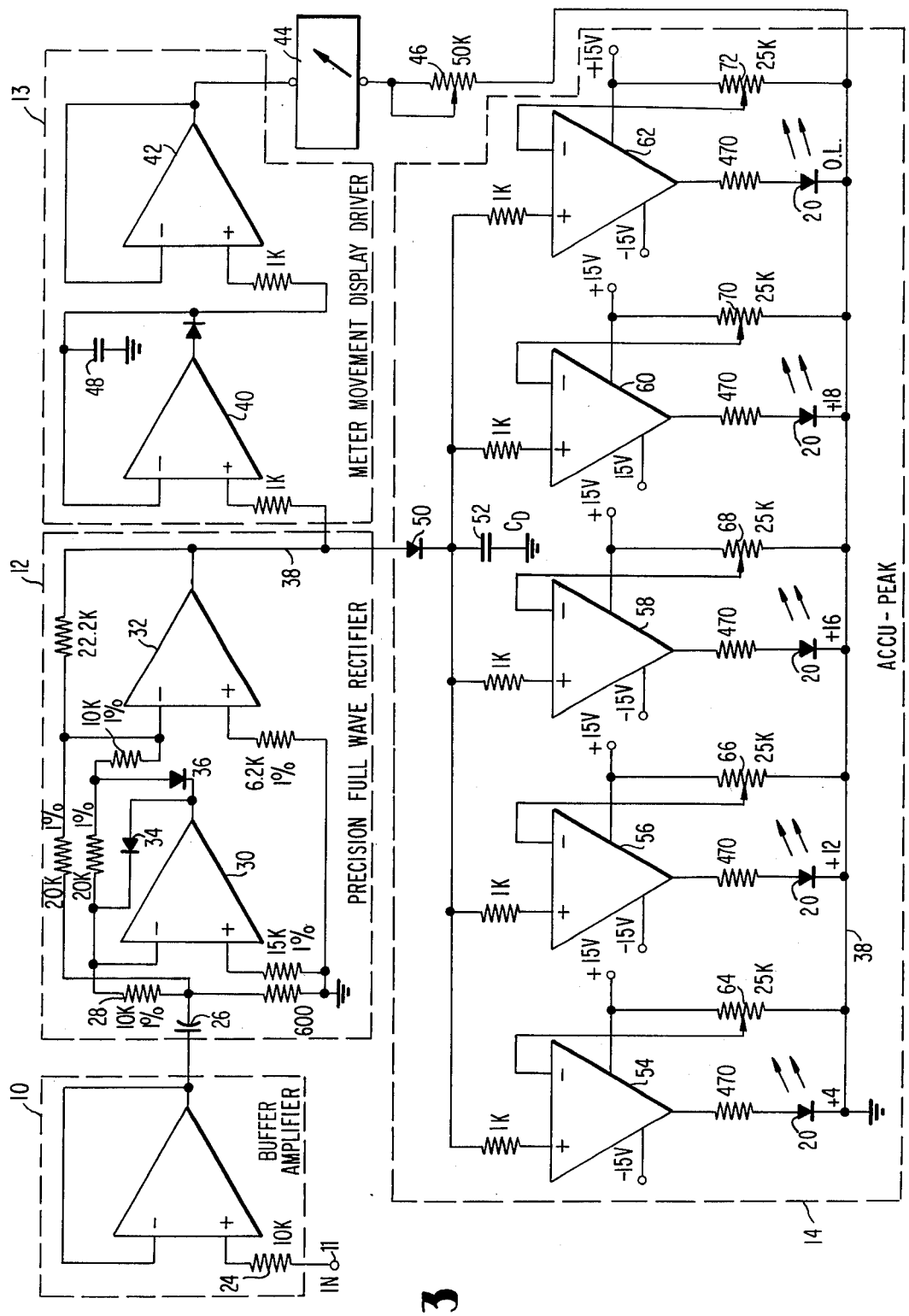

In FIG. 3, the audio signal monitor is shown, wherein an input terminal of the buffer amplifier 10 is connected, as illustrated through a series resistor 24 of 10,000 ohms to input terminal 11. Input terminal 11 is connected to receive the audio signal which is to be monitored. This buffer amplifier has a high input impedance to isolate the monitor from the monitored circuit supplying the audio signal, and preferably has unity gain. The output signal from the buffer 10 is applied through a capacitor 26 and a resistor 28, the precision full wave rectifier 12.

The output signal is received at an inverting input of the amplifier 30. The amplifier 30 with amplifier 32 and diodes 34 and 36, preferably of 1N914 type, are connected in a precision full wave rectifier configuration providing a unidirectional (d.c.) voltage, varying substantially linearly with the amplitude of the signal applied at input terminal 11, on an output conductor 38.

The rectifier output signal on conductor 38 is input to the meter movement display driver 13, which functions as a combination peak detector and sample and hold circuit. The meter movement display driver 13 preferably comprises amplifiers 40 and 42 which energize a meter movement 44 with an energization voltage to cause it to indicate the instantaneous peak voltage level of the audio input signal and to indicate the integrated program energy over a longer period. The meter movement display driver 13 energizes the meter movement 44 to indicate an integration of the program energy by causing the instantaneous energization voltage to fall back slowly when the audio input signal level drops.

In dynamic condition, with pulsed random input, the rise time of the meter movement 44 is approximately 0.05 seconds to indicate 90% of the applied level at any frequency or pulse duration within the range of any voice or instrument. The overshoot of the meter is a direct function of integrated program energy and is normally 0.1 to 1.0 db, settling to actual levels within 0.05 seconds or less. This characteristic enables an operator controlling the signal level in a monitored circuit to initiate adjustments before a potentially unacceptable level occurs. By the selection of a peak sampling capacitor 48 having an appropriate value, a predetermined time constant is selected, and the "fall back time" of the meter movement to fall from full scale to zero, allowing accommodations to suite the program material is selectable from approximately 0.1 second to 10 seconds.

The capacitor 48 is charged up as the voltage output from the amplifier 40 increases. As the output of the amplifier 40 decreases the diode 41 becomes reverse biased preventing discharge of the capacitor 48. Therefore, the peak voltages are held at a level at the non-inverting input of amplifier 42 allowing enough time for the meter movement to fully respond and indicate the amplitude of each peak, including those of relatively short duration. The fall back time is determined by the length of time it takes for the capacitor to discharge through the inverting input of amplifier 40 to ground.

The potentiometer 46 is used for calibrating the meter deflection according to various known audio input levels.

The instantaneous voltage signal from the precision full wave rectifier 12 is applied on lead 38 to the anode electrode of silicon rectifier 50. The cathode electrode of the rectifier 50 is connected to the ungrounded terminal of a capacitor 52. The ungrounded terminal of capacitor 52 is also connected in parallel through a plurality of 1000 ohm resistors to the non-inverting input terminals of amplifiers 54, 56, 58 60 and 62. The inverting input terminals of the amplifiers are connected to adjustable contact arms of corresponding 25k ohm potentiometers 64, 66, 68, 70 and 72.

Potentiometers 64, 66, 68, 70 and 72 are connected between a regulated +15v power source and ground, and provide adjustable voltages to the inverting inputs of respectively corresponding comparators 54, 56, 58, 60 and 62. A threshold level is set in each comparator at the inverting input. Therefore, when the d.c. signal at the non-inverting input exceeds the preset threshold level at the corresponding inverting input, the comparator switches from an approximately −15v output voltage to an approximately +15v output signal and energizes the corresponding LED indicator 20.

By setting the comparators at different threshold levels, the corresponding LED indicators are caused to be energized when the d.c. level exceeds each level.

In this case, the threshold levels for comparators 54, 56 58, 60 and 62 are preset to energize their corresponding LED indicators when the audio input signal exceeds +4, +12, +16, +18 and O.L. (overload) levels, respectively, for a period of 10-14 milliseconds.

The period of 10-14 milliseconds is determined by dynamic forward resistance characteristics of the rectifier 50 and the leakage resistance of the capacitor 52. It has been discovered by the inventor that an RC time delay exists in the present configuration, between the time when a pulse is applied to the anode of the rectifier 50 and the time when the capacitor 52 stores a charge having a value equal to the applied pulse. Therefore, the combination of the rectifier 50 and the capacitor 52 are properly selected and tested so as to give a delay of 10-14 milliseconds. In operation, whenever the audio input signal level is sustained for more than 10-14 milliseconds, the corresponding LED indicators are selectively energized. (The period of 10-14 milliseconds corresponds to the shortest time in which the human ear can detect signal clipping).

Alternative to the potentiometer arrangement, individual threshold voltage sources could provide the different threshold levels for each comparator.

In operation, the input of the audio signal monitor is bridged across an audio system at the point to be monitored. An oscilloscope may be employed to determine what the actual overload or clipping level is at that point in the system, and the system overload calibration on the monitor may be adjusted to energize the overload LED at this level. All of the other LEDs having been calibrated relative to their respective levels and, the meter is ready to use for control purposes.

It will be apparent that the coordinated display of the meter and the LEDs provides much more significant information than the prior art VU meter by itself. Thus, the LED's provision of an indication of the highest signal level that has been sustained for at least the last 10-14 milliseconds enables the operator to anticipate the direction and level toward which the meter is heading and commence adjustments before and not after the system has been overloaded.

As a modification, the present peak level meter may be provided with a conventional VU meter circuit for the meter movement and an appropriate switch for substituting this circuit for the circuit described herein for energizing the meter movement. In that event, the display may also be provided with the conventional VU meter scale.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An indicating instrument for displaying characteristics of an audio frequency signal subject to variations in amplitude, comprising high impedance input means for producing a first signal having a voltage varying in amplitude in proportion to said amplitude variations of said audio frequency signal, a display device including a meter for indicating instantaneous peaks in said amplitude variations and means for indicating sustained peaks in said amplitude variations, said indicating means comprising a plurality of light emitting diodes respectively corresponding to different predetermined threshold levels, a peak detector circuit responsive to variations in said first signal for driving said meter, and threshold circuit means supplied with said predetermined threshold levels and responsive to said first signal for selectively energizing said light emitting diodes upon the amplitude of said first signal attaining said respectively corresponding predetermined threshold levels for a predetermined sustained period of time.

2. The instrument defined in claim 1 wherein said predetermined sustained period of time is at least about 10 to 14 milliseconds.

3. The instrument defined in claim 2 wherein said meter indicator and said light emitting diodes are disposed on said display device in such position as to be simultaneously observed.

4. The instrument defined in claim 2, wherein said display device includes a scale of progressive amplitude levels, and further wherein said light emitting diodes are disposed adjacent their corresponding predetermined threshold levels along said scale.

5. The instrument defined in claim 1 wherein said high impedance input means comprises a high impedance buffer amplifier.

6. The instrument defined in claim 1 wherein said high impedance input means includes a precision full wave rectifier providing said first signal.

7. The instrument defined in claim 1 wherein said high impedance input includes a high impedance buffer amplifier and a precision full wave rectifier responsive to said amplifier to provide said first signal.

8. An indicating instrument for displaying characteristics of an audio frequency signal subject to variation in amplitude comprising:
high impedance input means for producing a voltage signal varying in voltage in proportion to the amplitude variations of said audio frequency signal;
a meter including an operating movement and indicating means movable in response thereto;
a display device including said indicating means and a plurality of light emitting diodes located so as to be simultaniously viewable;
a peak detector and a sample and hold circuit responsive to variations in said voltage signal for energizing said meter to cause the indicating means to instantaneously respond to peak amplitude variations of said voltage signal and provide an indication of integrated energy level thereof; and
circuit means responsive to said voltage signal for actuating selected ones of said light emitting diodes upon said voltage signal attaining different corresponding predetermined amplitude levels for a predetermined period of time.

9. An audio signal amplitude monitor comprising:
a high impedance input circuit responsive to an audio input signal for producing a unity gain signal;

a circuit responsive to said unity gain signal for producing a d.c. signal proportional to the amplitude of said audio input signal;

a meter movement driver circuit responsive to said d.c. signal for producing a driver signal having a level which instantaneously corresponds to peaks in said d.c. signal and corresponds to a predetermined fall back rate when said d.c. signal falls below said peaks;

a meter responsive to said driver signal for indicating the instantaneous peak level of said monitored audio input signal and for indicating an integration of the audio input signal energy in accordance with said predetermined fall back rate when said monitored audio input signal falls below said peaks;

a threshold level circuit responsive to said d.c. signal being maintained at at least one predetermined threshold level for a predetermined time period for producing a corresponding energization signal; and a corresponding threshold level indicator responsive to said energization signal for producing a visual indication corresponding to the amplitude of said monitored audio input signal exceeding said threshold level for said predetermined time period.

10. An audio amplitude monitor as in claim 9, wherein said high impedance input circuit is a buffer amplifier and said circuit for producing a d.c. signal is a full wave precision rectifier.

11. An audio amplitude monitor as in claim 9, wherein said threshold level circuit is simultaneously responsive to said d.c. signal being maintained at several predetermined threshold levels for at least said predetermined time period to produce correspondingly separate energization signals.

12. An audio amplitude monitor as in claim 11 including a plurality of threshold level indicators respectively corresponding to said several predetermined threshold levels and being responsive to said corresponding energization signals.

13. An audio amplitude monitor as in claim 12, wherein said plurality of said threshold level indicators being located along the scale of said meter adjacent graduations corresponding to their respective threshold levels.

14. An audio amplitude monitor as in claim 13, wherein said threshold level indicators are LED's.

15. An audio amplitude monitor as in claim 14, wherein said predetermined time period is at least 10 milliseconds.

16. An audio amplitude monitor as in claim 15, wherein said time period is at least 10 to 14 milliseconds.

17. An audio amplitude monitor as in claim 9, wherein said predetermined time period is at least 10 to 14 milliseconds.

18. An audio amplitude monitor as in claim 9, wherein said threshold level indicator is a LED.

19. A system for monitoring audio signals comprising:

means for receiving and precision rectifying an audio signal for producing a d.c. signal output varying in amplitude in proportion to the amplitude of the audio input signal, means for peak detecting the d.c. signal output and producing a peak detected output signal representative of instantaneous amplitude peaks of the audio input signal, said peak detecting means producing a slow fall-off of said peak detected output signal following detection of an instantaneous peak of the audio input signal, a meter having a scale of values corresponding to amplitude levels of the audio signal and movable indicator means for indicating a value on said scale, said meter being responsive to said peak detected output signal for moving said movable indicator relative to said scale to provide an indication on said scale of the instantaneous amplitude peaks of the audio input signal, said slow fall-off of said peak detected output signal thereby providing an indication of the integrated signal energy of the audio input signal, means for supplying a plurality of predetermined threshold level signals, comparator means for comparing the level of said d.c. output signal when sustained for at least a predetermined time period with said plurality of predetermined threshold level signals for producing a threshold comparator output signal respectively associated with the predetermined threshold level signal exceeded by said d.c. output signal, and said meter further including plural threshold level indicating means respectively corresponding to said predetermined threshold level signals and selectively energized in response to the respectively associated threshold comparator output signals for indicating the level of sustained peaks of the audio signal.

20. A monitoring system as recited in claim 19 wherein the level of one of said threshold level signals corresponds to an overload condition and wherein the corresponding indicator means is independent of said scale and, when energized, indicates an overload condition.

21. An audio monitoring system as recited in claim 19 wherein it is further provided:

high input impedance buffer means for receiving the audio signal and supplying the same to said precision rectifying means thereby to isolate said monitoring system from the audio signal circuit being monitored.

22. An audio monitoring system as recited in claim 19 wherein said peak detecting means includes integrating means responsive to the peak detected output for integrating same and producing said slow fall-off of the peak detected output.

23. An audio monitoring system as recited in claim 22 wherein said integrating means includes a capacitor for selectably altering the interval of the said fall-off of the peak detected output signal.

24. A monitoring system as recited in claim 19 wherein said comparator means includes a time constant circuit for developing a signal level corresponding to the d.c. output signal level during said predetermined time period when said d.c. output signal is sustained at said value for that predetermined time period.

* * * * *

UNITED STATES PATENT OFFICE
CERTIFICATE OF CORRECTION

Patent No. 4,061,042                    Dated December 16, 1977

Inventor(s) Wayne L. Hetrich

It is certified that error appears in the above-identified patent and that said Letters Patent are hereby corrected as shown below:

Column 3, line 68, insert -- to -- after "28,";
Column 4, line 35, "suite" should be -- suit --:
Column 4, line 58, insert -- , -- after "58";
Column 5, line 9, insert -- , -- after "56";
Column 6, line 54, "simultaniously" should be
   -- simultaneously --.

Signed and Sealed this

Eleventh Day of April 1978

[SEAL]

Attest:

RUTH C. MASON
Attesting Officer

LUTRELLE F. PARKER
Acting Commissioner of Patents and Trademarks